United States Patent
Minamio et al.

(10) Patent No.: US 6,900,524 B1
(45) Date of Patent: May 31, 2005

(54) RESIN MOLDED SEMICONDUCTOR DEVICE ON A LEAD FRAME AND METHOD OF MANUFACTURING THE SAME

(75) Inventors: Masanori Minamio, Osaka (JP); Satoru Konishi, Kyoto (JP); Yoshihiko Morishita, Osaka (JP); Yuichiro Yamada, Kyoto (JP); Fumito Itoh, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/380,312

(22) PCT Filed: Jun. 8, 1998

(86) PCT No.: PCT/JP98/02544

§ 371 (c)(1),
(2), (4) Date: Sep. 21, 2000

(87) PCT Pub. No.: WO99/00826

PCT Pub. Date: Jan. 7, 1999

(30) Foreign Application Priority Data

Jun. 27, 1997 (JP) ............................................. 9-171395
Mar. 23, 1998 (JP) ........................................... 10-073711

(51) Int. Cl.⁷ ............................................. H01L 23/48
(52) U.S. Cl. ...................... 257/669; 257/666; 257/784; 361/813
(58) Field of Search ................................ 257/666, 667, 257/668, 669, 670, 671, 672, 673, 674, 675, 676, 677, 784, 790, 787; 29/841, 856; 361/813

(56) References Cited

U.S. PATENT DOCUMENTS 3,825,803 A * 7/1974 Budde ..................... 317/234 R
4,707,724 A * 11/1987 Suzuki et al. ................. 357/71
4,994,895 A * 2/1991 Matsuzaki et al. ............ 357/52
5,299,092 A * 3/1994 Yaguchi et al. ............. 361/728

(Continued)

FOREIGN PATENT DOCUMENTS

| JP | 54106776 | 1/1978 |
| JP | 54106776 | 7/1979 |
| JP | 60086851 | 5/1985 |
| JP | 61001042 | 1/1986 |

(Continued)

OTHER PUBLICATIONS

International Search Report dated Mar. 19, 1999.
International Preliminary Examination Report dated Oct. 19, 1999.

*Primary Examiner*—Kamand Cuneo
*Assistant Examiner*—Lourdes Cruz
(74) *Attorney, Agent, or Firm*—Stevens, Davis, Miller & Mosher, LLP.

(57) ABSTRACT

A resin molded type semiconductor device has: a semiconductor chip (12) which is mounted on a die pad portion (11) of a lead frame (9); thin metal wires (14) which connect terminals of the semiconductor chip (12) to inner lead portions (13) of the lead frame (9); and a sealing resin (15), and the lead frame (9) is subjected to an upsetting process so that a supporting portion (11) is located at a position higher than the inner lead portions (13). Since the sealing resin of a thickness corresponding to the step difference of the upsetting exists below the supporting portion, the adhesiveness between the lead frame and the sealing resin can be improved, and high reliability and thinning are realized. Since at least one groove portion is disposed in the surface of each of the inner lead portions (13), the anchoring effect to the sealing resin (15), stress acting on a lead portion of a product, and stress to the thin metal wires (14) can be relaxed, and leads and the thin metal wires can be prevented from peeling off.

33 Claims, 6 Drawing Sheets

U.S. PATENT DOCUMENTS

| | | | | |
|---|---|---|---|---|
| 5,389,739 A | * | 2/1995 | Mills | 174/52.4 |
| 5,436,492 A | * | 7/1995 | Yamanaka | 257/433 |
| 5,648,683 A | * | 7/1997 | Takahashi | 257/685 |
| 5,729,051 A | * | 3/1998 | Nakamura | 257/668 |
| 5,777,380 A | * | 7/1998 | Otsuki et al. | 257/675 |
| 5,859,387 A | * | 1/1999 | Gagnon | 174/52.2 |
| 5,869,889 A | * | 2/1999 | Chia et al. | 257/701 |
| 5,872,395 A | * | 2/1999 | Fujimoto | 257/675 |
| 6,072,239 A | * | 6/2000 | Yoneda et al. | 257/730 |

FOREIGN PATENT DOCUMENTS

| | | | | |
|---|---|---|---|---|
| JP | 6142856 | 3/1986 | | |
| JP | 63064351 | 3/1988 | | |
| JP | 63258050 | 10/1988 | | |
| JP | 01106455 | 4/1989 | | |
| JP | 01106456 | 4/1989 | | |
| JP | 02201946 | 8/1990 | | |
| JP | 04155854 | * 10/1990 | | 257/666 |
| JP | 04085952 | 3/1992 | | |
| JP | 04155854 | 5/1992 | | |
| JP | 4123550 | 11/1992 | | |
| JP | 05129473 | 5/1993 | | |
| JP | 621304 | 1/1994 | | |
| JP | 621315 | 1/1994 | | |
| JP | 685132 | 3/1994 | | |
| JP | 6104364 | 4/1994 | | |
| JP | 750380 | 2/1995 | | |

* cited by examiner

RESIN MOLDED SEMICONDUCTOR DEVICE ON A LEAD FRAME AND METHOD OF MANUFACTURING THE SAME

TECHNICAL FIELD

The invention relates to a resin molded type semiconductor device in which a semiconductor chip is mounted on a lead frame and the outer periphery of the semiconductor chip, particularly, the upper face of the semiconductor chip is molded by a sealing resin, and also to a method of manufacturing the semiconductor device.

BACKGROUND ART

Recently, as the density of board mounting advances, semiconductor products which are to be mounted on a board are requested to be miniaturized and thinned. In order to realize miniaturization and thinning, the TAB mounting technique using a resin tape has been developed. In a development of a thin semiconductor product using a lead frame, a resin molded type semiconductor device of the single-side molding type in which a semiconductor chip is mounted on a lead frame and the mounting face is molded by a sealing resin has been developed.

Hereinafter, a resin molded type semiconductor device of the prior art will be described. FIG. 5 is a section view showing a resin molded type semiconductor device of the prior art.

In the resin molded type semiconductor device of the prior art shown in FIG. 5, a semiconductor chip 3 is mounted on a die pad portion 2 of a lead frame 1, and terminals (not shown) of the semiconductor chip 3 are electrically connected to inner lead portions 4 of the lead frame 1 by thin metal wires 5. In a single face of the lead frame 1, i.e., the face of the lead frame 1 on which the semiconductor chip 3 is mounted, the outer peripheral region of the semiconductor chip 3 is molded by a sealing resin 6.

In a resin molded type semiconductor device produced so as to have a structure such as shown in FIG. 5 is provided with a structure in which an outer lead portion 7 serving as external terminals is arranged on a bottom face of the semiconductor device. Since only the face of the lead frame 1 on which the semiconductor chip 3 is mounted is molded by the sealing resin 6 and the rear face of the lead frame 1 is not substantially molded, it is possible to realize a thin resin molded type semiconductor device.

Next, in a method of manufacturing the resin molded type semiconductor device of the prior art shown in FIG. 5, a tapered shape is first formed at tip end portions of the inner lead portions 4 of the lead frame 1 by mechanical or chemical working, and the semiconductor chip 3 is then bonded onto the lead frame 1. Thereafter, the semiconductor chip 3 is electrically connected to the inner lead portions 4 of the lead frame 1 by the thin metal wires 5, and the face of the lead frame 1 for mounting the semiconductor chip 3 is then molded by the sealing resin 6 by means of transfer molding. In order to form external terminals, finally, the outer lead portion 7 of the lead frame 1 which projects from the sealing resin 6 is worked, thereby completing the resin molded type semiconductor device.

In the prior art, in addition to a resin molded type semiconductor device of the structure shown in FIG. 5, also a structure shown in FIG. 6 is employed.

In the resin molded type semiconductor device shown in FIG. 6, an insulative resin tape 8 on which a semiconductor chip 3 is to be mounted is bonded to tip end portions 4a of inner lead portions 4 of a lead frame 1, thereby forming a die pad portion. The device has a structure in which, after the semiconductor chip 3 is mounted on the resin tape 8, terminals of the semiconductor chip 3 are electrically connected to the inner lead portions 4 by thin metal wires 5, and the face of the lead frame 1 for mounting the semiconductor chip 3 is molded by a sealing resin 6. The resin molded type semiconductor device shown in FIG. 6 has the merit that the device can be made thinner than the resin molded type semiconductor device shown in FIG. 5. Specifically, in the resin molded type semiconductor device shown in FIG. 6, the resin tape 8 is bonded to the lower faces of the inner lead portions 4 of the lead frame 1 and the semiconductor chip 3 is mounted on the upper face of the portion. Therefore, the step difference between the upper faces of the inner lead portions 4 and the upper face of the semiconductor chip 3 is reduced. As a result, also the resin thickness of the sealing resin 6 is reduced, and the resulting resin molded type semiconductor device has a reduced thickness. In the resin molded type semiconductor device shown in FIG. 5, since the semiconductor chip 3 is mounted on the die pad portion 2 which is in the same level as the inner lead portions 4, the thickness of the sealing resin 6 cannot be reduced by such a degree that is attained in the resin molded type semiconductor device shown in FIG. 6.

In order to realize thinning, however, a resin molded type semiconductor device of the prior art has a structure in which substantially only the face of a lead frame on which a semiconductor chip is mounted, i.e., the upper face of the lead frame is molded by a sealing resin. Even when a tapered shape is formed in an inner lead portion, therefore, the contact area between the lead frame and the sealing resin is reduced as a whole, thereby producing a problem in that the adhesiveness is impaired and the reliability of a product is lowered. Since such a device has a structure in which substantially only the single face of the lead frame is resin-molded, there are further problems in that the semiconductor chip is adversely affected by stress of the sealing resin, and that package crack occurs in the sealing resin. When the inner lead portions are connected to the semiconductor chip by thin metal wires and single-side molding is performed, there arises a further problem in that, because of stress in the single-side molding structure, a load due to the stress acts on the inner lead portions which are connected by thin metal wires, and the connecting portions are broken, with the result that a connection failure occurs.

Therefore, it is an object of the invention to provide a resin molded type semiconductor device which solves the above-discussed problems of the prior art, in which the adhesiveness between a lead frame and a sealing resin is maintained and stable connection between thin metal wires and inner lead portions are enabled, which has high reliability, and in which thinning is realized, and a method of manufacturing the semiconductor device.

DISCLOSURE OF INVENTION

In order to attain the object, the resin molded type semiconductor device of the invention comprises: a semiconductor chip which is mounted on a die pad portion of a lead frame; thin metal wires which electrically connect terminals of an upper face of the semiconductor chip to inner lead portions of the lead frame; a sealing resin which seals an outer peripheral region of the semiconductor chip, the region including a thin metal wire region of the upper face of the semiconductor chip, and a lower region of the die pad portion; and outer lead portions which are arranged in a bottom face region of the sealing resin, and is characterized in that the lead frame is subjected to an upsetting process so that the die pad portion is located at a position higher than the inner lead portions.

In this way, the lead frame is subjected to an upsetting process so that the die pad portion is located at a position higher than the inner lead portions. Therefore, the sealing resin of a thickness corresponding to the step difference of the upsetting exists below the die pad portion, the adhesiveness between the lead frame and the sealing resin can be improved, and the reliability of a product can be maintained. Even when both the faces, or the upper and lower faces of the lead frame are resin-molded, the thickness of the resin of the lower face is equal to a value corresponding to the step difference of the upsetting. Consequently, the thinning can be realized.

Furthermore, the resin molded type semiconductor device of the invention comprises: a semiconductor chip which is mounted on a die pad portion of a lead frame; thin metal wires which electrically connect terminals of an upper face of the semiconductor chip to inner lead portions of the lead frame; a sealing resin which seals an outer peripheral region of the semiconductor chip, the region including a thin metal wire region of the upper face of the semiconductor chip; and outer lead portions which are arranged in a bottom face region of the sealing resin and which are formed to be continuous to the respective inner lead portions, wherein at least one groove portion is formed in a surface of each of the inner lead portions.

In this way, at least one groove portion is formed in the surface of each of the inner lead portions. Therefore, the anchoring effect to the sealing resin can be improved, stress acting on a lead portion of a product, and stress to the thin metal wires can be relaxed, and leads and the thin metal wires can be prevented from peeling off. Consequently, the reliability of a product can be maintained.

Furthermore, the resin molded type semiconductor device of the invention comprises: a semiconductor chip which is mounted on a die pad portion of a: lead frame; thin metal wires which electrically connect terminals of an upper face of the semiconductor chip to inner lead portions of the lead frame; a sealing resin which seals an outer peripheral region of the semiconductor chip, the region including a thin metal wire region of the upper face of the semiconductor chip; and outer lead portions which are arranged in a bottom face region of the sealing resin and which are formed to be continuous to the respective inner lead portions, and is characterized in that a plurality of groove portions are formed in a surface of each of the inner lead portions, and a connecting portion of the thin metal wire on a side of the inner lead portion is disposed between the groove portions.

In this way, a plurality of groove portions are formed in the surface of each of the inner lead portions, and a connecting portion of the thin metal wire on the side of the inner lead portion is disposed between the groove portions. Therefore, the anchoring effect to the sealing resin can be improved, stress acting on a lead portion of a product, and stress to the thin metal wires can be relaxed, and leads and the thin metal wires can be prevented from peeling off. In this case, stress due to the structure in which the single face of the lead frame is molded by the sealing resin is absorbed by the groove portions, and does not act on an area between the groove portions. Therefore, the connecting portions of the thin metal wires are not broken and stable connection is enabled.

Furthermore, the resin molded type semiconductor device of the invention comprises: a semiconductor chip which is mounted on a die pad portion of a lead frame; thin metal wires which electrically connect terminals of an upper face of the semiconductor chip to inner lead portions of the lead frame; a sealing resin which seals an outer peripheral region of the semiconductor chip, the region including a thin metal wire region of the upper face of the semiconductor chip; and outer lead portions which are arranged in a bottom face region of the sealing resin and which are formed to be continuous to the respective inner lead portions, and is characterized in that a widened portion is formed in each of the inner lead portions.

In this way, a widened portion is formed in the inner lead portions. Therefore, the anchoring effect to the sealing resin can be improved, stress acting on a lead portion of a product, and stress to the thin metal wires can be relaxed, and leads and the thin metal wires can be prevented from peeling off. Consequently, the reliability of a product can be maintained.

Furthermore, the resin molded type semiconductor device of the invention comprises: a semiconductor chip which is mounted on a die pad portion of a lead frame; thin metal wires which electrically connect terminals of an upper face of the semiconductor chip to inner lead portions of the lead frame; a sealing resin which seals an outer peripheral region of the semiconductor chip, the region including a thin metal wire region of the upper face of the semiconductor chip; and outer lead portions which are arranged in a bottom face region of the sealing resin and which are formed to be continuous to the respective inner lead portions, and is characterized in that a widened portion is formed in each of the inner lead portions and at least one groove portion is formed in a surface.

In this way, a widened portion is formed in each of the inner lead portions and at least one groove portion is formed in the surface. Therefore, the anchoring effect to the sealing resin can be further improved, stress acting on a lead portion of a product, and stress to the thin metal wires can be further relaxed, and the effect of preventing leads and the thin metal wires from peeling off is enhanced.

Furthermore, the resin molded type semiconductor device of the invention comprises: a semiconductor chip which is mounted on a die pad portion of a lead frame; thin metal wires which electrically connect terminals of an upper face of the semiconductor chip to inner lead portions of the lead frame; a sealing resin which seals an outer peripheral region of the semiconductor chip, the region including thin metal wire region of the upper face of the semiconductor chip; and outer lead portions which are arranged in a bottom face region of the sealing resin and which are formed to be continuous to each of the inner lead portions, and is characterized in that a widened portion is formed in each of the inner lead portions, a plurality of groove portions are formed in a surface, and connecting portions of the thin metal wires on a side of the inner lead portion are disposed between the groove portions.

In this way, a widened portion is formed in each of the inner lead portions, a plurality of groove portions are formed in the surface, and connecting portions of the thin metal wires on a side of the inner lead portion are disposed between the groove portions. Therefore, the anchoring effect to the sealing resin can be further improved, stress acting on a lead portion of a product, and stress to the thin metal wires can be further relaxed, and the effect of preventing leads and the thin metal wires from peeling off is enhanced. In this case, when two or more groove portions are disposed and the thin metal wires are connected to an area between the groove portions, the effect of absorbing stress can be enhanced.

Moreover, stress due to the structure in which the single face of the lead frame is molded by the sealing resin is absorbed by the groove portions, and does not act on an area between the groove portions. Therefore, the connecting portions of the thin metal wires are not broken and stable connection is enabled.

According to the resin molded type semiconductor device of the invention, in the above configuration, exposed faces of the outer lead portions are arranged in a same level as an outer face of the sealing resin. In this way, the exposed faces of the outer lead portions are arranged in the same level as the outer face of the sealing resin. Unlike the prior art, therefore, the outer lead portions can be arranged so as to be embedded in the bottom face portion of the sealing resin, while the outer lead portions project from a side face of the sealing resin. Therefore, the reliability of the outer lead portions serving as external terminals can be improved, and it is possible to provide a resin molded type semiconductor device which is miniaturized by a size corresponding to the nonprojecting structure of the outer lead portions.

Furthermore, the method of manufacturing a resin molded type semiconductor device of the invention comprises the steps of: performing an upsetting process on a lead frame so that a die pad portion is located at a position higher than inner lead portions; bonding a semiconductor chip to the die pad portion of the lead frame; electrically connecting terminals of the semiconductor chip to the inner lead portions of the lead frame by thin metal wires; sealing an outer peripheral region of the semiconductor chip, thereby forming a sealing resin, the region including a region of an upper face of the semiconductor chip and electrically connected by the thin metal wires, and a lower region of the die pad portion; and shaping outer lead portions of the lead frame so as to be exposed from an outer face of the sealing resin.

In this way, the lead frame is subjected to an upsetting process so that the die pad portion is located at a position higher than the inner lead portions, and the outer peripheral region of the semiconductor chip including the region of the upper face of the semiconductor chip and electrically connected by the thin metal wires, and the lower region of the die pad portion is molded to form the sealing resin. Therefore, the sealing resin of a thickness corresponding to the step difference of the upsetting exists below the die pad portion, the adhesiveness between the lead frame and the sealing resin can be improved, and the reliability of a product can be maintained. Even when both the faces, or the upper and lower faces of the lead frame are resin-molded, the thickness of the resin of the lower face is equal to the thickness of the step difference of the upsetting. Consequently, the thinning can be realized.

Furthermore, the method of manufacturing a resin molded type semiconductor device of the invention is characterized in that the method comprises the steps of: bonding a semiconductor chip to a lead frame having inner lead portions in each of which a widened portion is disposed and at least one groove portion is formed in a surface; electrically connecting terminals of the semiconductor chip to the inner lead portions of the lead frame by thin metal wires; sealing an outer peripheral region of the semiconductor chip, thereby forming a sealing resin, the region including a region of an upper face of the semiconductor chip and electrically connected by the thin metal wires, and a lower region of the semiconductor chip; and shaping outer lead portions of the lead frame so as to be exposed from an outer face of the sealing resin, and, when the terminals of the semiconductor chip are to be electrically connected to the inner lead portions by the thin metal wires, the connection is performed while connecting portions of the thin metal wires on the side of the inner lead portions are disposed in the vicinity of the groove portion.

In this way, when the terminals of the semiconductor chip are to be electrically connected to the inner lead portions by the thin metal wires, the connection is performed while connecting portions of the thin metal wires on the side of the inner lead portions are disposed in the vicinity of the groove portion. Therefore, stress due to the structure in which the single face of the lead frame is molded by the sealing resin is absorbed by the groove portion, the connecting portions of the thin metal wires are not broken, and stable connection is enabled. Moreover, the anchoring effect to the sealing resin can be improved, and stress acting on a lead portion of a product can be relaxed by the groove portion, and leads and the thin metal wires can be prevented from peeling off.

Furthermore, the method of manufacturing a resin molded type semiconductor device of the invention is characterized in that the method comprises the steps of: bonding a semiconductor chip to a lead frame having inner lead portions in each of which a widened portion is disposed and a plurality of groove portions are formed in a surface; electrically connecting terminals of the semiconductor chip to the inner lead portions of the lead frame by thin metal wires; sealing an outer peripheral region of the semiconductor chip, thereby forming a sealing resin, the region including a region of an upper face of the semiconductor chip and electrically connected by the thin metal wires, and a lower region of the semiconductor chip; and shaping outer lead portions of the lead frame so as to be exposed from an outer face of the sealing resin, and, when the terminals of the semiconductor chip are to be electrically connected to the inner lead portions by the thin metal wires, the connection is performed while connecting portions of the thin metal wires on the side of the inner lead portions are disposed between the groove portions.

In this way, when the terminals of the semiconductor chip are to be electrically connected to the inner lead portions by the thin metal wires, the connection is performed while connecting portions of the thin metal wires on the side of the inner lead portions are disposed between the groove portions. Therefore, stress due to the structure in which the single face of the lead frame is molded by the sealing resin is absorbed by the groove portions, and does not act on an area between the groove portions. Consequently, the connecting portions of the thin metal wires are not broken, and stable connection is enabled. In this case, when two or more groove portions are disposed and the thin metal wires are connected to an area between the groove portions, the effect of absorbing stress can be enhanced. Moreover, the anchoring effect to the sealing resin can be further improved, and stress acting on a lead portion of a product can be further relaxed by the plural groove portions, and the effect of preventing leads and the thin metal wires from peeling off is enhanced.

BEST MODE FOR CARRYING OUT THE INVENTION

A resin molded type semiconductor device of an embodiment of the invention will be described with reference to FIGS. 1 to 4.

Figure 1:
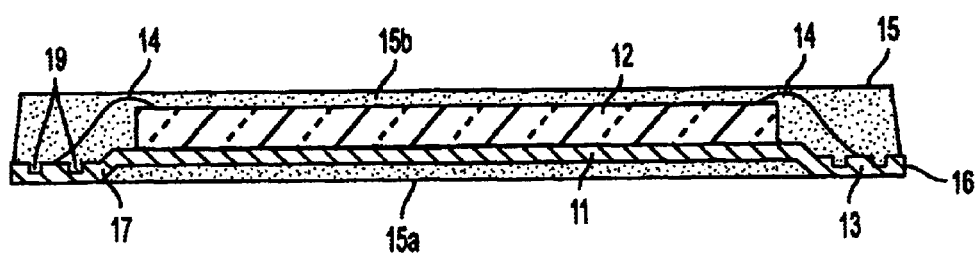
FIG. 1 is a section view showing a resin molded type semiconductor device of an embodiment of the invention.
Figure 2:
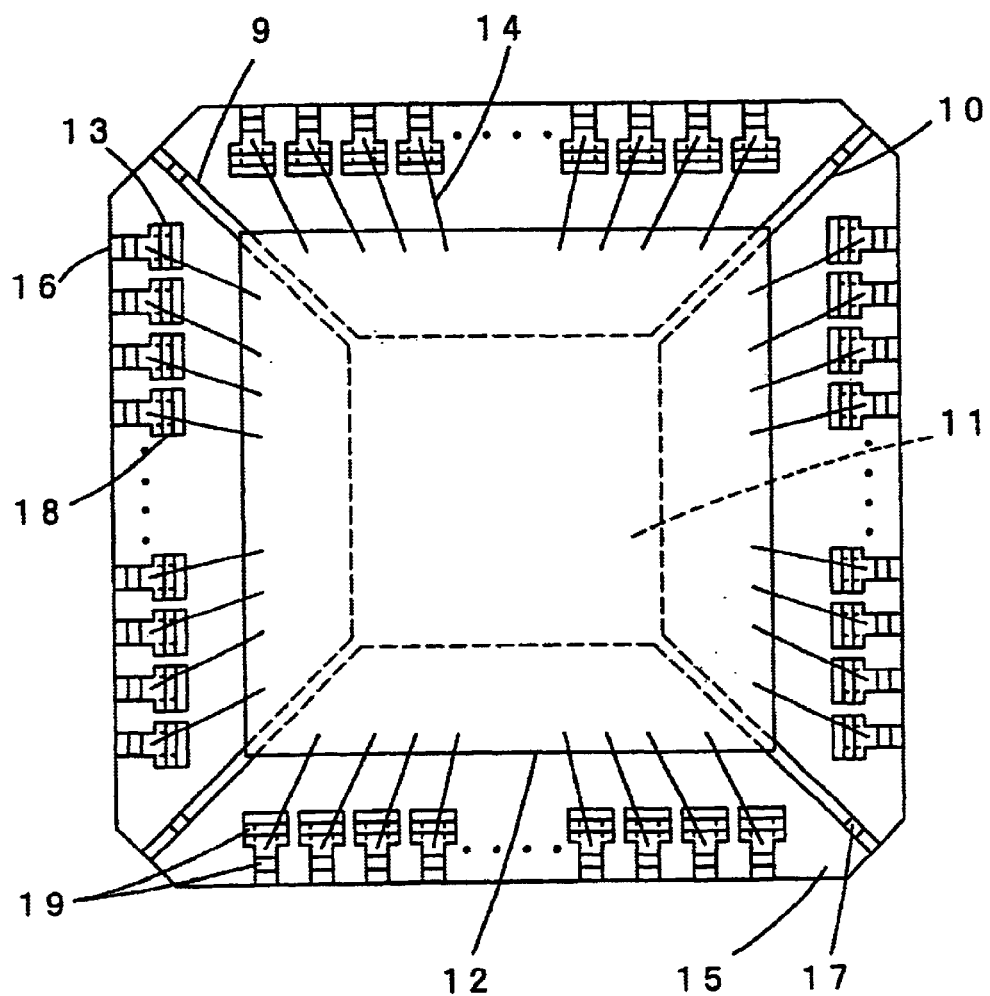
FIG. 2 is a plan view showing the resin molded type semiconductor device of the embodiment of the invention.
Figure 3:
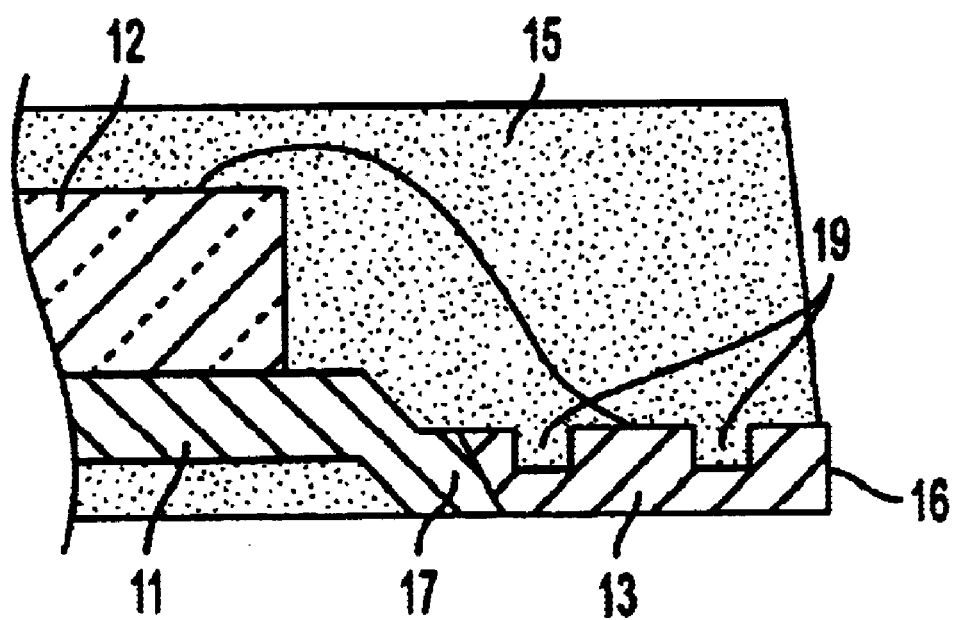
FIG. 3 is an enlarged section view of main portions of the resin molded type semiconductor device of the embodiment of the invention.
Figure 4A:
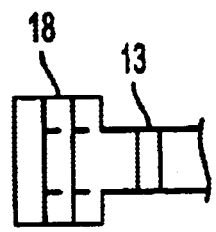
FIG. 4(a) is a plan view of an inner lead portion of the resin molded type semiconductor device of the embodiment of the invention.
Figure 4B:
FIG. 4(b) is a left side view.
Figure 4C:
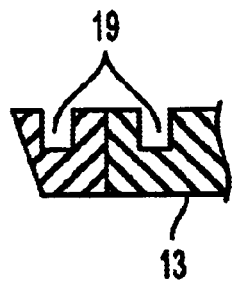
FIG. 4(c) is a front view.
Figure 5:
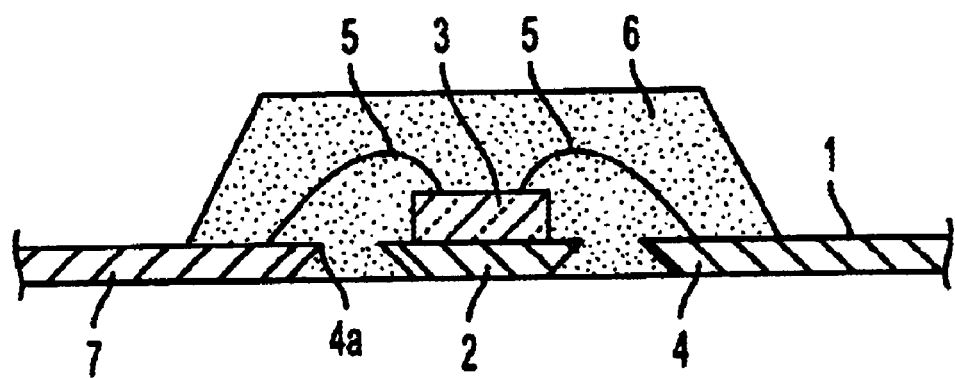
FIG. 5 is a section view of a resin molded type semiconductor device of the prior art.
Figure 6:
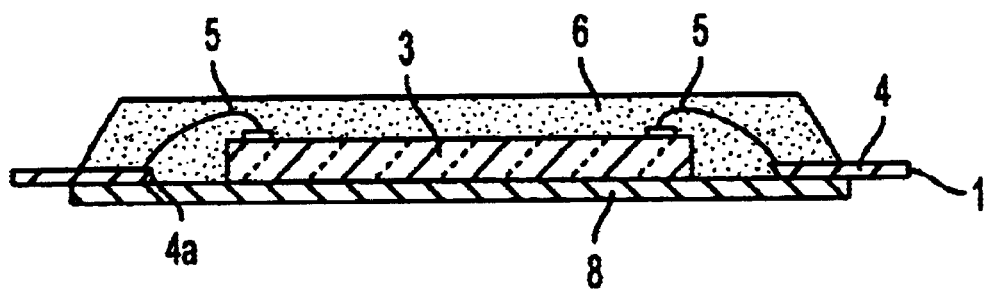
FIG. 6 is a section view showing another example of a resin molded type semiconductor device of the prior art.

FIG. 1 is a section view of the resin molded type semiconductor device of the embodiment of the invention, FIG. 2 is a plan view of the device, FIG. 3 is an enlarged section view showing an inner lead portion of the device, FIG. 4(a) is an enlarged plan view showing a tip end of the inner lead portion, FIG. 4(b) is a left side view, and FIG. 4(c) is a front view. In FIG. 2, for the sake of convenience, the plan view is a view which is obtained by partially removing away a sealing resin, in order to show the internal structure. In the figure, broken lines show a die pad portion and part of suspension leads.

As shown in FIGS. 1 and 2, the resin molded type semiconductor device comprises: a semiconductor chip 12 which is mounted on a die pad portion 11 of a lead frame 9 and serving as a supporting portion of the semiconductor chip 12 supported by suspension leads 10; thin metal wires 14 which electrically connect terminals of the upper face of the semiconductor chip 12 to inner lead portions 13 of the lead frame 9; a sealing resin 15 which seals an outer peripheral region of the semiconductor chip 12 including a thin metal wire 14 region of the upper face of the semiconductor chip 12, and a lower region of the die pad portion 11; and outer lead portions 16 which are arranged in a bottom face region of the sealing resin 15, which are formed to be continuous to the respective inner lead portions 13, and which serve as external terminals. The lead frame 9 is subjected to an upsetting process so that the die pad portion 11 is located at a position higher than the inner lead portions 13. In the embodiment, the device is configured so that the die pad portion 11 is smaller in area than the semiconductor chip 12 to be mounted. As described above, in the resin molded type semiconductor device, the suspension leads 10 are subjected to an upsetting process, and a step portion 17 is provided. Therefore, a sealing resin 15a can exist also below the die pad portion 11. Although the device is of the thin type, the device is a semiconductor device which is substantially of the double-side molding type with respect to the lead frame 9.

Figure 1A:
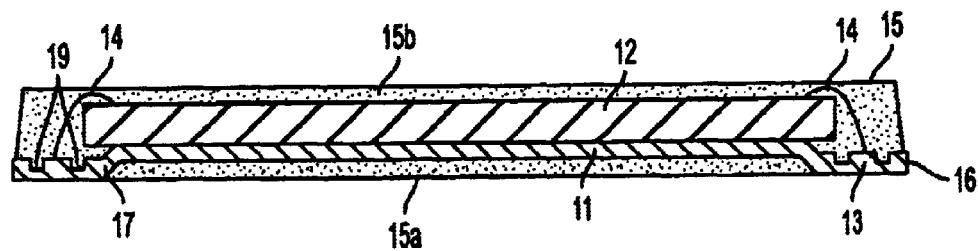
FIG. 1A illustrates the resin contacting the bottom of the chip.

FIG. 1A shows chip 12 wider than die pad portion 11, with the resin 15 thus contacting the bottom of the chip. As noted below, there is contact through adhesiveness between the resin and the rear face of chip 12.

As shown in FIGS. 3 and 4, each of the inner lead portions 13 has a widened portion 18 at a tip end portion, and a plurality of groove portions 19 are formed in the surface. In the end face of the tip end portion of the inner lead portion 13, a reverse taper is formed in the thickness direction. The outer lead portions 16 are arranged so that their exposed faces are in a substantially same level as a side face portion of the sealing resin 15, and do not protrude from the sealing resin 15 unlike the prior art configuration. Therefore, deformation of the outer lead portions 16, and the like can be prevented from occurring, and the device is a semiconductor device of the surface mount type. Moreover, the connecting portion of each thin metal wire 14 on the side of the inner lead portion 13 are disposed between the groove portions 19.

The resin molded type semiconductor device of the embodiment is a resin molded type semiconductor device which is very thin or has a total thickness of 0.7 [mm], and has a target thickness which is not larger than a sum of the thickness of a semiconductor chip and 1 [mm]. The step difference of the upsetting process of the suspension leads 10 is 0.1 [mm], and the thickness of the sealing resin 15a below the die pad portion 11 is 0.1 [mm]. The thickness of the semiconductor chip 12 is 0.2 [mm], and a sealing resin 15b above the die pad portion 11 is 0.15 [mm].

Next, a method of manufacturing the resin molded type semiconductor device of the embodiment shown in FIGS. 1 to 4 will be described.

First, the suspension leads 10 supporting the die pad portion 11 of the lead frame 9 is pressurized to be subjected to an upsetting process, thereby forming the step portion 17. The semiconductor chip 12 is bonded at the bottom face side to the die pad portion 11 of the lead frame 9 by an electrically conductive adhesive agent.

Next, the terminals of the semiconductor chip 12 on the die pad portion i are electrically connected to the inner lead portions 13 of the lead frame 9 by the thin metal wires 14. At this time, each thin metal wire 14 which is to be connected to the side of the corresponding inner lead portion 13 is connected so as to exist between two groove portions 19 which are disposed in the surface of the inner lead portion 13.

Next, the outer peripheral region of the semiconductor chip 12 is molded by the sealing resin 15 by means of transfer molding. In this case, the upper face of the semiconductor chip 12, i.e., the region where electrical connection is done by the thin metal wires 14, and the lower region of the die pad portion 11 are molded, thereby forming the sealing resin 15a and the sealing resin 15b. The thickness of the sealing by the sealing resin 15 is set so that the sealing resin 15a below the die pad portion 11 is flush with the bottom face of the inner lead portion 13 and the sealing resin 15b on the upper face of the semiconductor chip 12 has a thickness which is larger than the loop height of the thin metal wires 14. In the resin sealing step, the sealing must be performed so as to attain excellent air tightness so that the sealing resin 15 does not enter the bottom region of the inner lead portions 13.

Then, the outer lead portions 16 of the lead frame 9 are shaped so as to be exposed with being flush with the outer face of the sealing resin 15.

As a result of the above-described steps, it is possible to realize a resin molded type semiconductor device of the double-side molding type with respect to the lead frame 9. Because of the double-side molding structure, the adhesiveness between the sealing resin 15 and the lead frame 9 is ensured, and package crack is prevented from occurring, thereby enabling the reliability to be maintained.

Furthermore, by the widened portion 18 and the groove portions 19 which are disposed in the surface of each of the inner lead portions 13, the adhesiveness with the sealing resin 15 can be improved, and stress which acts on the inner lead portions 13 and due to the single-side molding structure can be relaxed, and also the adhesiveness (anchoring effect) with the sealing resin 15 can be improved. In other words, dislocation from the sealing resin 15 to the inner lead portions 13 is prevented from occurring.

With respect to the inner lead portions 13, the sealing resin 15 is formed into the single-side molding structure. According to this structure, therefore, stress by the sealing resin 15 acts on the inner lead portions 13. However, the groove portions 19 are formed in the inner lead portions 13, and the stress acting on the inner lead portions 13 can be absorbed by the groove portions 19 so as to be relaxed. Since the connecting portions are disposed between the groove portions 19, the connecting portions are not damaged by the stress to be broken.

As described above, according to the embodiment, the suspension leads 10 of the lead frame 9 are subjected to the upsetting process, and the die pad portion 11 is raised to a level higher than the inner lead portions 13. Therefore, the sealing resin 15 of a thickness corresponding to the step difference of the upsetting exists below the die pad portion 11, the adhesiveness between the lead frame 9 and the sealing resin 15 can be improved, and the reliability of a product can be maintained. Unlike the prior art, the outer lead portions 16 are arranged so as to be embedded into the bottom face portion of the sealing resin 15 without projecting from the side face of the sealing resin 15. Therefore, the reliability of the outer lead portions serving as external terminals can be improved, and it is possible to provide a resin molded type semiconductor device which is miniaturized by a size corresponding to the nonprojecting structure of the outer lead portions. Even when both the faces, or the upper and lower faces of the lead frame 9 are resin-molded, the thickness of the resin of the lower face is equal to the thickness of the step difference of the upsetting. Consequently, the thinning can be realized.

Furthermore, the reduction of the area of the die pad portion 11, and the disposition of an opening can enhance the adhesiveness between the sealing resin 15 and the rear face of the semiconductor chip 12, and the reliability can be ensured.

Furthermore, the adhesiveness with the sealing resin can be improved, and stress which acts on the inner lead portions 13 and due to the single-side molding structure can be relaxed by the widened portion 18 and the groove portions 19 which are disposed in the surface of each of the inner lead portions 13. Particularly, the groove portions 19 absorb stress to the connecting portions of the thin metal wires 14 on the side of the inner lead portions 13. Therefore, the connecting portions of the thin metal wires 14 are not affected by stress, breakage of the connecting portions is prevented from occurring, stable connection is enabled, and the reliability of a product can be improved, whereby the reliability of the resin molded type semiconductor device can be improved.

In the embodiment, the number of the groove portions 19 of each of the inner lead portions 13 is two. Alternatively, a single groove portion may be disposed and the thin metal wire may be connected to the vicinity of the groove portion, whereby stress acting on the inner lead portion 13 and that on the thin metal wire can be relaxed. Alternatively, two or more groove portions may be formed, and the thin metal wire may be connected to an area between the groove portions, whereby the effect of absorbing stress can be enhanced. The groove direction of the groove portions elongates along a side face of the semiconductor device. Alternatively, the groove direction may be set to be any direction such as that which intersects a side face. The groove portions may be formed into a mesh-like shape in which grooves elongate longitudinally and latitudinally. Both the groove portions and the widened portion are disposed. Alternatively, only one of the two kinds of portions may be disposed.

What is claimed is:

1. A resin molded type semiconductor device comprising:
   a semiconductor chip which is mounted on a die pad of a lead frame;
   thin metal wires which electrically connect terminals of an upper face of said semiconductor chip to inner lead portions of the lead frame;
   a sealing resin which seals an outer peripheral region of said semiconductor chip, said region including a thin metal wire region of the upper face of said semiconductor chip, and a lower region of said die pad; and
   outer lead portions which are arranged in a bottom face region of said sealing resin,
   wherein said lead frame is subjected to an upsetting process so that said die pad is located at a position higher than said inner lead portions and at least a portion of the outer periphery of the semiconductor chip extends outward from the outer periphery of said die pad.

2. A resin molded type semiconductor device comprising:
   a semiconductor chip which is mounted on a die pad of a lead frame;
   thin metal wires which electrically connect terminals of an upper face of said semiconductor chip to inner lead portions of said lead frame;
   a sealing resin which seals an outer peripheral region of said semiconductor chip, said region including a thin metal wire region of the upper face of said semiconductor chip; and
   outer lead portions which are arranged in a bottom face region of said sealing resin and which are formed to be continuous to respective inner lead portions,
   wherein at least one groove portion is formed in a surface of each of said inner lead portions and at least a portion of the outer periphery of the semiconductor chip extends outward from the outer periphery of said die pad.

3. A resin molded type semiconductor device comprising:
   a semiconductor chip which is mounted on a die pad of a lead frame;
   thin metal wires which electrically connect terminals of an upper face of said semiconductor chip to inner lead portions of said lead frame;
   a sealing resin which seals an outer peripheral region of said semiconductor chip and which contacts a bottom face of said semiconductor chip, said region including a thin metal wire region of the upper face of said semiconductor chip; and
   outer lead portions which are arranged in a bottom face region of said sealing resin and which are formed to be continuous to respective inner lead portions,
   wherein a widened portion is formed in each of said inner lead portions.

4. A resin molded type semiconductor device comprising:
   a semiconductor chip which is mounted on a die pad of a lead frame;
   thin metal wires which electrically connect terminals of an upper face of said semiconductor chip to inner lead portions of said lead frame;
   a sealing resin which seals an outer peripheral region of said semiconductor chip and which contacts a bottom face of said semiconductor chip, said region including a thin metal wire region of the upper face of said semiconductor chip; and
   outer lead portions which are arranged in a bottom face region of said sealing resin and which are formed to be continuous to respective inner lead portions,
   wherein a widened portion is formed in each of said inner lead portions and at least one groove portion is formed in a surface of each of said inner lead portions.

5. A resin molded type semiconductor device comprising:
a semiconductor chip which is mounted on a die pad of a lead frame;
thin metal wires which electrically connect terminals of an upper face of said semiconductor chip to inner lead portions of said lead frame;
a sealing resin which seals an outer peripheral region of said semiconductor chip, said region including a thin metal wire region of the upper face of said semiconductor chip; and
outer lead portions which are arranged in a bottom face region of said sealing resin and which are formed to be continuous to respective inner lead portions, and
a widened portion is formed in each of said inner lead portions,
at least one groove portion is formed in a surface of each of said inner lead portions,
a connecting portion of each of said thin metal wires is coupled to a respective inner lead portion at a surface region of said respective inner lead portion adjacent said at least one groove portion.

6. A resin molded type semiconductor device according to claim 1, wherein exposed faces of said outer lead portion are arranged in a same level as an outer face of said sealing resin.

7. A method of manufacturing a resin molded type semiconductor device, said method comprising the steps of:
performing an upsetting process on a lead frame so that a die pad of said lead frame is located at a position higher than inner lead portions of said lead frame;
bonding a semiconductor chip to said die pad portion of said lead frame,
wherein at least a portion of the outer periphery of the semiconductor chip extends outward from the outer periphery of said die pad;
electrically connecting terminals of said semiconductor chip to said inner lead portions of said lead frame by thin metal wires;
sealing an outer peripheral region of said semiconductor chip, thereby forming a sealing resin, said region including a region of an upper face of said semiconductor chip that is electrically connected by said thin metal wires, and a lower region of said die pad portion; and
shaping outer lead portions of the lead frame so as to be exposed from an outer face of said sealing resin.

8. A method of manufacturing a resin molded type semiconductor device, said method comprising the steps of:
bonding a semiconductor chip to a lead frame having inner lead portions in each of which a widened portion is disposed and having a flat surface in which at least one groove portion is formed;
electrically connecting terminals of said semiconductor chip to said inner lead portions of said lead frame by thin metal wires;
sealing an outer peripheral region of said semiconductor chip, thereby forming a sealing resin, said region including a region of an upper face of said semiconductor chip and electrically connected by said thin metal wires, and a lower region of said semiconductor chip; and shaping outer lead portions of said lead frame so as to be exposed from an outer face of said sealing resin, and, when said terminals of said semiconductor chip are to be electrically connected to said inner lead portions by said thin metal wires, the connection is performed while connecting portions of said thin metal wires on the side of said inner lead portions are disposed at the flat surface adjacent said at least one groove portion.

9. A method of manufacturing a resin molded type semiconductor device, said method comprising the steps of:
bonding a semiconductor chip to a lead frame having inner lead portions in each of which a widened portion is disposed and at least one groove portion is formed;
electrically connecting terminals of said semiconductor chip to said inner lead portions of said lead frame by thin metal wires;
sealing an outer peripheral region of said semiconductor chip, thereby forming a sealing resin, said region including a region of an upper face of said semiconductor chip and electrically connected by said thin metal wires, and a lower region of said semiconductor chip; and
shaping outer lead portions of said lead frame so as to be exposed from an outer face of said sealing resin, and, when said terminals of said semiconductor chip are to be electrically connected to said inner lead portions by said thin metal wires, the connection is performed while connecting portions of said thin metal wires are coupled to respective inner lead portions at a flat surface region of said respective inner lead portion adjacent at least one groove portion.

10. A resin molded type semiconductor device according to claim 2, wherein exposed faces of said outer lead portion are arranged in a same level as an outer face of said sealing resin.

11. A resin molded type semiconductor device according to claim 3, wherein exposed faces of said outer lead portion are arranged in a same level as an outer face of said sealing resin.

12. A resin molded type semiconductor device according to claim 4, wherein exposed faces of said outer lead portion are arranged in a same level as an outer face of said sealing resin.

13. A resin molded type semiconductor device according to claim 5, wherein exposed faces of said outer lead portion are arranged in a same level as an outer face of said sealing resin.

14. A resin molded type semiconductor device according to claim 2, wherein said respective inner lead portion includes a flat surface region adjacent said at least one groove portion and said at least one grove portion comprises a plurality of grooves which define a contact portion therebetween, said flat surface region being located on said contact portion.

15. A resin molded type semiconductor device according to claim 3, wherein at least one groove portion is formed in a surface of each of said inner lead portions.

16. A resin molded type semiconductor device according to claim 5, wherein said surface region is flat.

17. A resin molded type semiconductor device according to claim 5, wherein said at least one grove is a plurality of grooves which define a contact portion therebetween, said flat surface region located on said contact portion.

18. A method of manufacturing a resin molded type semiconductor device according to claim 9, wherein said at least one grove is a plurality of grooves which define a contact portion therebetween, said flat surface region located on said contact portion.

19. A resin molded type semiconductor device according to claim 1, wherein the entire outer periphery of the semiconductor chip extends outward from the outer periphery of said die pad.

20. A resin molded type semiconductor device according to claim 2, wherein the entire outer periphery of the semiconductor chip extends outward from the outer periphery of said die pad.

21. A method of manufacturing a resin molded type semiconductor device according to claim 7, wherein the entire outer periphery of the semiconductor chip extends outward from the outer periphery of said die pad.

22. A resin molded type semiconductor device according to claim 1, wherein said die pad is smaller in size than said semiconductor chip.

23. A resin molded type semiconductor device according to claim 2, wherein said die pad is smaller in size than said semiconductor chip.

24. A method of manufacturing a resin molded type semiconductor device according to claims 7, wherein said die pad is smaller in size than said semiconductor chip.

25. A resin molded type semiconductor device according to claim 1, wherein said die pad is smaller in area than said semiconductor chip.

26. A resin molded type semiconductor device according to claim 2, wherein said die pad is smaller in area than said semiconductor chip.

27. A method of manufacturing a resin molded type semiconductor device according to claim 7, wherein said die pad is smaller in area than said semiconductor chip.

28. A resin molded type semiconductor device comprising:

a lead frame comprising a die pad and leads including inner lead portions and outer lead portions;

each of the inner lead portions including at least one groove portion which is formed in a surface thereof;

a semiconductor chip mounted on said die pad;

said die pad being disposed higher than an upper face of said inner lead portions;

thin metal wires which electrically connect terminals of said semiconductor chip to said inner lead portions at a position not on top of said groove;

a sealing resin which seals an outer peripheral region of said semiconductor chip and an entire upper region of said inner lead portions and outer lead portions, said outer peripheral region including a region of said thin metal wires and a lower region of said die pad; and wherein said sealing resin leaves a an entire bottom surface of said inner lead portions unsealed.

29. A resin molded type semiconductor device according to claim 28, wherein at least a portion of said outer periphery of said semiconductor chip extends outward from said outer periphery of said die pad.

30. A resin molded type semiconductor device according to claim 28, wherein said at least one groove portion receives said sealing resin therein.

31. A resin molded type semiconductor device according to claim 28, wherein a total thickness is not greater than a sum of a thickness of said semiconductor chip and 1 mm.

32. The resin molded type semiconductor device according to claim 28, wherein exposed faces of said outer lead portions are arranged in a same plane as an outer face of said sealing resin.

33. The resin molded type semiconductor device according to claim 28, wherein said at least one groove portion absorbs stress at a connection between said thin metal wires and said inner lead portions.

* * * * *